United States Patent
Zheng et al.

(10) Patent No.: US 11,513,175 B2
(45) Date of Patent: Nov. 29, 2022

(54) TUNNEL MAGNETORESISTANCE SENSOR DEVICES AND METHODS OF FORMING THE SAME

(71) Applicant: GLOBALFOUNDRIES Singapore Pte. Ltd., Singapore (SG)

(72) Inventors: Ping Zheng, Singapore (SG); Eng Huat Toh, Singapore (SG); Kazutaka Yamane, Singapore (SG); Shyue Seng Tan, Singapore (SG); Kiok Boone Elgin Quek, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 297 days.

(21) Appl. No.: 16/787,226

(22) Filed: Feb. 11, 2020

(65) Prior Publication Data
US 2021/0247470 A1    Aug. 12, 2021

(51) Int. Cl.
*H01L 27/22* (2006.01)
*G01R 33/09* (2006.01)
(Continued)

(52) U.S. Cl.
CPC ....... *G01R 33/098* (2013.01); *H01F 10/3259* (2013.01); *H01F 10/3286* (2013.01);
(Continued)

(58) Field of Classification Search
CPC ........ H01L 27/22; H01L 43/02; H01L 43/12; G01R 33/098; H01F 10/3259; H01F 10/3286; H01F 41/34
(Continued)

(56) References Cited

U.S. PATENT DOCUMENTS

2008/0100289 A1* 5/2008 Zimmer ............... G01R 33/093
324/252
2008/0272771 A1* 11/2008 Guo .................... G01R 33/093
324/260
(Continued)

OTHER PUBLICATIONS

Franco et al., "Reconfigurable Spintronics Wheatstone Bridge Sensors With Offset Voltage Compensation at Wafer Level", IEEE Transactions on Magnetics, Jul. 2019, 5 pages, vol. 55, No. 7, IEEE.
(Continued)

*Primary Examiner* — Jami Valentine Miller
(74) *Attorney, Agent, or Firm* — Viering Jentschura & Partner MBB

(57) ABSTRACT

A semiconductor device may be provided including a first series portion and a second series portion electrically connected in parallel with the first series portion. The first series portion may include a first MTJ stack and a first resistive element electrically connected in series. The second series portion may include a second MTJ stack and a second resistive element electrically connected in series. The first resistive element may include a third MTJ stack and the second resistive element may include a fourth MTJ stack. The first, second, third, and fourth MTJ stacks may include a same number of layers, which may include a fixed layer, a free layer, and a tunnelling barrier layer between the fixed layer and the free layer. Alternatively, the first resistive element may include a first transistor and the second resistive element may include a second transistor.

19 Claims, 8 Drawing Sheets

(51) Int. Cl.
*H01L 43/02* (2006.01)
*H01F 41/34* (2006.01)
*H01F 10/32* (2006.01)
*H01L 43/12* (2006.01)

(52) U.S. Cl.
CPC ............. *H01F 41/34* (2013.01); *H01L 27/22* (2013.01); *H01L 43/02* (2013.01); *H01L 43/12* (2013.01)

(58) Field of Classification Search
USPC ........................................................ 257/427
See application file for complete search history.

(56) References Cited

U.S. PATENT DOCUMENTS

| | | | | |
|---|---|---|---|---|
| 2009/0243607 | A1* | 10/2009 | Mather | G01R 33/093 324/249 |
| 2009/0279212 | A1* | 11/2009 | Engel | G01R 33/093 216/22 |
| 2017/0212175 | A1* | 7/2017 | Holm | G01R 33/0005 |
| 2018/0335486 | A1* | 11/2018 | Lassalle-Balier | G01R 33/093 |

OTHER PUBLICATIONS

Jeng et al., "Vector Magnetometer with Dual-Bridge GMR Sensors", IEEE Transactions on Magnetics, Jan. 2014, 4 pages, vol. 50, No. 1, IEEE.

Ferreira et al., "2-Axis Magnetometers Based on Full Wheatstone Bridges Incorporating Magnetic Tunnel Junctions Connected in Series", IEEE Transactions on Magnetics, Nov. 2012, 4 pages, vol. 48, No. 11, IEEE.

Nakano et al., "Magnetic Tunnel Junctions With [Co/Pd]-Based Reference Layer and CoFeB Sensing Layer for Magnetic Sensor", IEEE Transactions on Magnetics, Jul. 2016, 4 pages, vol. 52, No. 7, IEEE.

Ogasawara et al., "Effect of second-order magnetic anisotropy on nonlinearity of conductance in CoFeB/MgO/CoFeB magnetic tunnel junction for magnetic sensor devices", Scientific Reports, 2019, pp. 1-9, vol. 9, No. 1.

* cited by examiner

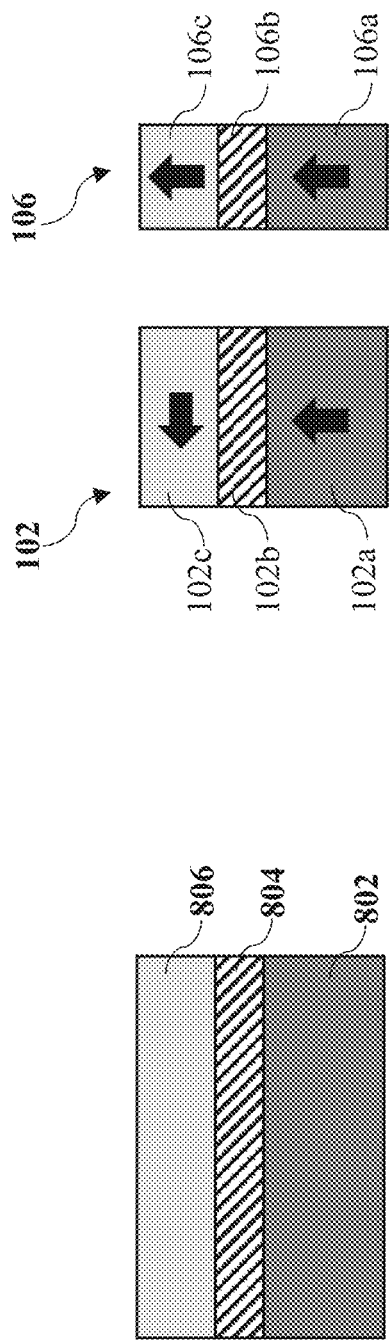

TUNNEL MAGNETORESISTANCE SENSOR DEVICES AND METHODS OF FORMING THE SAME

TECHNICAL FIELD

The present disclosure relates generally to semiconductor devices and methods of forming the semiconductor devices.

BACKGROUND

Sensor devices capable of sensing magnetic fields have been used in various industries, such as in the automotive and consumer electronics industries. For example, the sensor devices may be used for sensing currents, positions, speeds and angles in these industries. Sensor devices may include sensor elements such as hall sensors, anisotropic magnetoresistance (AMR) sensors, giant magnetoresistance (GMR) sensors and tunnel-magnetoresistance (TMR) sensors.

TMR sensors generally perform better than the other types of sensor elements in terms of their output, accuracy and stability. A TMR sensor typically includes a magnetic tunnel junction (MTJ) stack having a tunnel barrier layer sandwiched between a fixed/pinned ferromagnetic layer and a free ferromagnetic layer. The magnetic orientation of the fixed layer is usually fixed; whereas, the magnetic orientation of the free layer can change in accordance with an external magnetic field. When the magnetic orientations of the fixed and free layers are parallel, the resistance of the TMR sensor is lower and when the magnetic orientations of the fixed and free layers are anti-parallel, the resistance of the TMR sensor is higher. Accordingly, the external magnetic field may be determined based on the resistance of the TMR sensor.

To date, many sensor devices using TMR sensors have been developed. Some of these sensor devices utilize the TMR sensors either alone, or together with other components in a Wheatstone bridge to improve the sensitivity of the sensor devices. However, the fabrication process of such sensor devices is often complex. For example, multiple steps may be required to fabricate the different types of MTJ stacks to be used in the Wheatstone bridge. In addition, some sensor devices include large components such as parasitic resistors and therefore, the sizes of these sensor devices are large as well.

SUMMARY

According to various non-limiting embodiments, there is provided a semiconductor device including: a first series portion including a first magnetic tunnel junction (MTJ) stack and a first resistive element electrically connected in series; and a second series portion including a second MTJ stack and a second resistive element electrically connected in series, the second series portion being electrically connected in parallel with the first series portion. The first resistive element may include a third MTJ stack and the second resistive element may include a fourth MTJ stack, where the first MTJ stack, the second MTJ stack, the third MTJ stack, and the fourth MTJ stack may include a same number of layers, which may include a fixed layer, a free layer, and a tunnelling barrier layer between the fixed layer and the free layer; or the first resistive element may include a first transistor and the second resistive element may include a second transistor.

According to various non-limiting embodiments, there is provided a method for fabricating a semiconductor device, the method including: forming a first MTJ stack, a second MTJ stack, a first resistive element, and a second resistive element; electrically connecting the first MTJ stack, the second MTJ stack, the first resistive element, and the second resistive element such that the first MTJ stack and the first resistive element may be electrically connected in series to form a first series portion, the second MTJ stack and the second resistive element may be electrically connected in series to form a second series portion and the second series portion may be electrically connected in parallel with the first series portion. The first resistive element may include a third MTJ stack and the second resistive element may include a fourth MTJ stack; where the first MTJ stack, the second MTJ stack, the third MTJ stack, and the fourth MTJ stack may include a same number of layers, which may include a fixed layer, a free layer, and a tunnelling barrier layer between the fixed layer and the free layer; or the first resistive element may include a first transistor and the second resistive element may include a second transistor.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Embodiments of the invention will now be illustrated for the sake of example only with reference to the following drawings, in which:

FIGS. 8A and 8B show simplified cross-sectional views illustrating simultaneous fabrication of MTJ stacks of the semiconductor device of FIG. 1.

DETAILED DESCRIPTION

Figure 1:
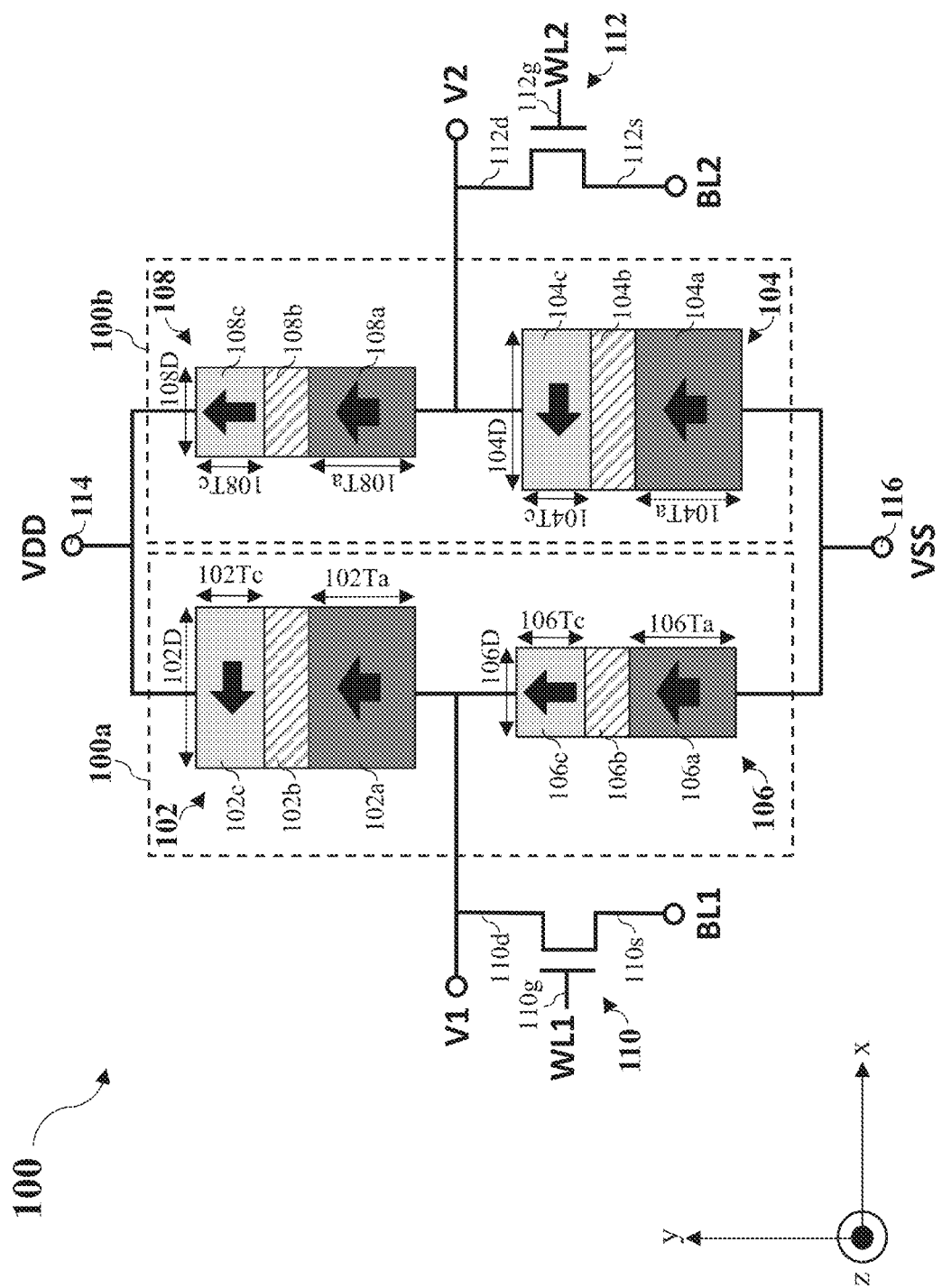
FIG. 1 shows a simplified schematic diagram of a semiconductor device according to various non-limiting embodiments.

The embodiments generally relate to semiconductor devices. More particularly, some embodiments relate to sensor devices including magnetic tunnel junction (MTJ) stacks. The sensor devices may be used for sensing external magnetic fields and may be used in various industries, such as, but not limited to, the automotive and consumer electronics industries.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

FIG. 1 shows a simplified schematic diagram of a semiconductor device 100 according to various non-limiting embodiments. The semiconductor device 100 may be a sensor device and may include a Wheatstone bridge.

As shown in FIG. 1, the semiconductor device 100 may include a first series portion 100a and a second series portion 100b. The first series portion 100a may include a first MTJ stack 102 and a first resistive element 106 electrically connected in series. The second series portion 100b may include a second MTJ stack 104 and a second resistive element 108 electrically connected in series. The first and second resistive elements 106, 108 may also be referred to as bridge resistors. In the non-limiting embodiment of FIG. 1, the first resistive element 106 may include a third MTJ stack and the second resistive element 108 may include a fourth MTJ stack.

The first MTJ stack 102, the second MTJ stack 104, the first resistive element 106 (third MTJ stack) and the second resistive element 108 (fourth MTJ stack) may include a same number of layers. As shown in FIG. 1, each of the first and second MTJ stacks 102, 104 and the first and second resistive elements 106, 108 may include a fixed layer 102a, 104a, 106a, 108a, a free layer 102c, 104c, 106c, 108c, and a tunnelling barrier layer 102b, 104b, 106b, 108b between the fixed layer 102a, 104a, 106a, 108a and the free layer 102c, 104c, 106c, 108c. In some non-limiting embodiments, each of the first and second MTJ stacks 102, 104 and the first and second resistive elements 106, 108 may include a same number of further layers not shown in FIG. 1.

The fixed layers 102a, 104a, 106a, 108a and the free layers 102c 104c, 106c, 108c may include magnetic material, for example, ferromagnetic material, such as, but not limited to, iron, cobalt, boron, or combinations thereof. The tunnelling barrier layers 102b, 104b, 106b, 108b may include an insulating material that may be non-magnetic. For example, the tunnelling barrier layers 102b, 104b, 106b, 108b may include oxide material, such as, but not limited to, aluminum oxide, magnesium oxide or combinations thereof. The layers 104a-108a, 104b-108b, 104c-108c of the first MTJ stack 102, the second MTJ stack 104, the first resistive element 106 (third MTJ stack) and the second resistive element 108 (fourth MTJ stack) may include a same material, but may alternatively include different materials.

The first MTJ stack 102 may have a first resistance, the second MTJ stack 104 may have a second resistance, the first resistive element 106 (third MTJ stack) may have a third resistance and the second resistive element 108 (fourth MTJ stack) may have a fourth resistance. The third resistance of the first resistive element 106 (third MTJ stack) may be adjustable by adjusting one or more voltages to the first series portion 100a and the fourth resistance of the second resistive element 108 (fourth MTJ stack) may be adjustable by adjusting one or more voltages to the second series portion 100b. For example, referring to FIG. 1, the third resistance of the first resistive element 106 may be adjustable by adjusting a first voltage (V1) between the first MTJ stack 102 and the first resistive element 106, and the fourth resistance of the second resistive element 108 may be adjustable by adjusting a second voltage (V2) between the second MTJ stack 104 and the second resistive element 108.

In the non-limiting embodiment of FIG. 1, the device 100 may include a first voltage adjusting element 110 electrically connected between the first MTJ stack 102 and the first resistive element 106 to adjust the first voltage (V1). Similarly, the device 100 may also include a second voltage adjusting element 112 electrically connected between the second MTJ stack 104 and the second resistive element 108 to adjust the second voltage (V2). The first voltage adjusting element 110 may include a first voltage adjusting transistor and the second voltage adjusting element 112 may include a second voltage adjusting transistor. For example, as shown in FIG. 1, each voltage adjusting element 110, 112 may include a field effect transistor (FET) that may include a source 110s, 112s, a drain 110d, 112d and a gate 110g, 112g. The sources 110s, 112s of the first and second voltage adjusting elements 110, 112 may be connected to first and second bit lines BL1, BL2 respectively, and the gates 110g, 112g of the first and second voltage adjusting elements 110, 112 may be connected to first and second word lines WL1, WL2 respectively. The first voltage (V1) between the first MTJ stack 102 and the first resistive element 106 may be approximately equal to the drain voltage at the drain 110d of the first voltage adjusting element 110; whereas, the second voltage (V2) between the second MTJ stack 104 and the second resistive element 108 may be approximately equal to the drain voltage at the drain 112d of the second voltage adjusting element 112. Therefore, the first voltage (V1) may be adjusted by changing the drain voltage of the first voltage adjusting element 110, which may in turn be done by adjusting the gate-to-source voltage of the first voltage adjusting element 110 using the word line WL1 and the bit line BL1. Similarly, the second voltage (V2) may be adjusted by changing the drain voltage of the second voltage adjusting element 112, which may in turn be done by adjusting the gate-to-source voltage of the second voltage adjusting element 112 using the word line WL2 and the bit line BL2. For example, the source voltages of both voltage adjusting elements 110, 112 may be set as 0V using the bit lines BL1, BL2, and the gate voltages of these elements 110, 112 may be adjusted using the word lines WL1, WL2 to adjust the first and second voltages (V1, V2) respectively.

The first and second MTJ stacks 102, 104 and the first and second resistive elements 106, 108 (third and fourth MTJ stacks) may be configured such that the magnetization orientations of the fixed layers 102a, 104a, 106a, 108a of the first MTJ stack 102, the second MTJ stack 104, the first resistive element 106 (third MTJ stack), and the second resistive element 108 (fourth MTJ stack) may be substantially parallel; and the magnetization orientations of the free layers 106c, 108c of the first resistive element 106 (third MTJ stack) and the second resistive element 108 (fourth MTJ stack) may be substantially perpendicular to the magnetic orientations of the free layers 102c, 104c of the first MTJ stack 102 and the second MTJ stack 104. In other words, while the first and second MTJ stacks 102, 104 and the first and second resistive elements 106, 108 may all be perpendicular MTJs (p-MTJs) having perpendicular-plane fixed layers 102a, 104a, 106a, 108a, the first and second MTJ stacks 102, 104 may have in-plane free layers 102c, 104c; whereas, the first and second resistive elements 106, 108 (third and fourth MTJ stacks) may have perpendicular-plane free layers 106c, 108c.

The first and second MTJ stacks 102, 104 and the first and second resistive elements 106, 108 (third and fourth MTJ stacks) may be configured to achieve the above-mentioned magnetic orientations by for example, configuring the dimensions of the MTJ stacks 102, 104 and the resistive elements 106, 108.

In the non-limiting embodiment of FIG. 1, each of the first MTJ stack 102, the second MTJ stack 104, the first resistive element 106 (third MTJ stack) and the second resistive element 108 (fourth MTJ stack) may be cylindrical in shape, with all of its layers 102a-102c, 104a-104c, 106a-106c, 108a-108c having a same diameter. Accordingly, the first MTJ stack 102 may have a first diameter 102D, the second MTJ stack 104 may have a second diameter 104D, the first resistive element 106 (third MTJ stack) may have a third diameter 106D and the second resistive element 108 (fourth MTJ stack) may have a fourth diameter 108D. To achieve the above-mentioned magnetic orientations, the first and second MTJ stacks 102, 104 and the first and second resistive elements 106, 108 (third and fourth MTJ stacks) may be configured such that the third diameter 106D of the first resistive element 106 (third MTJ stack) may be smaller than the first diameter 102D of the first MTJ stack 102 and the second diameter 104D of the second MTJ stack 104; and the fourth diameter 108D of the second resistive element 108 (fourth MTJ stack) may be smaller than the first diameter 102D of the first MTJ stack 102 and the second diameter 104D of the second MTJ stack 104. The first diameter 102D of the first MTJ stack 102 and the second diameter 104D of the second MTJ stack 104 may be approximately equal. The third diameter 106D of the first resistive element 106 (third MTJ stack) and the fourth diameter 108D of the second resistive element 108 (fourth MTJ stack) may also be approximately equal. For example, the first and second diameters 102D, 104D of the first and second MTJ stacks 102, 104 may range from about 30 nm to about 100 nm; whereas, the third and fourth diameters 106D, 108D of the first and second resistive elements 106, 108 (third and fourth MTJ stacks) may range from about 10 nm to about 50 nm. A ratio of the third diameter 106D/fourth diameter 108D to the first diameter 102D/second diameter 104D may be less than one.

In the non-limiting embodiment of FIG. 1, the thicknesses 102Tc, 104Tc, 106Tc, 108Tc of the free layers 102c, 104c, 106c, 108c of the first MTJ stack 102, the second MTJ stack 104, the first resistive element 106 (third MTJ stack) and the second resistive element 108 (fourth MTJ stack) may be approximately equal. The thicknesses 102Tc, 104Tc of the free layers 102c, 104c of the first and second MTJ stacks 102, 104 may be smaller than their respective diameters 102D, 104D. For example, the thicknesses 102Tc, 104Tc, 106Tc, 108Tc of the free layers 102c, 104c, 106c, 108c of the first MTJ stack 102, the second MTJ stack 104, the first resistive element 106 (third MTJ stack) and the second resistive element 108 (fourth MTJ stack) may range from about 2 nm to about 5 nm, and in a non-limiting embodiment, may range from about 3 nm to about 4 nm.

In addition, the thicknesses 102Ta, 104Ta, 106Ta, 108Ta of the fixed layers 102a, 104a, 106a, 108a of the first and second MTJ stacks 102, 104 and the first and second resistive elements 106, 108 may be approximately equal and may be larger than the thicknesses 102Tc, 104Tc, 106Tc, 108Tc of the free layers 102c, 104c, 106c, 108c. For example, the thicknesses 102Ta, 104Ta, 106Ta, 108Ta of the fixed layers 102a, 104a, 106a, 108a of the first and second MTJ stacks 102, 104 and the first and second resistive elements 106, 108 may range from about 3 nm to about 25 nm.

As shown in FIG. 1, the semiconductor device 100 may also include a first voltage terminal 114 and a second voltage terminal 116. The second series portion 100b may be electrically connected in parallel with the first series portion 100a between the first and second voltage terminals 114, 116. As shown in FIG. 1, the first MTJ stack 102 and the second resistive element 108 may be connected to the first voltage terminal 114. Further, the second MTJ stack 104 and the first resistive element 106 may be connected to the second voltage terminal 116.

When the device 100 is in use, the first and second voltage terminals 114, 116 may be connected to external voltages. For example, the first voltage terminal 114 may be connected to a first external voltage VDD; whereas, the second voltage terminal 116 may be connected to a second external voltage VSS. The first external voltage VDD may be a supply voltage that may range from about −1V to about +1V; whereas, the second external voltage may be about 0V, i.e. the second voltage terminal 116 may be grounded.

The device 100 may be used as a sensor device to determine a magnitude of an external magnetic field. However, prior to applying the external magnetic field, the device 100 may be programmed by programming the third and fourth resistances of the first and second resistive elements 106, 108 (third and fourth MTJ stacks) respectively. This may be done by adjusting the first and second voltages (V1, V2), which may in turn be done by adjusting the gate-to-source voltages of the first and second voltage adjusting elements 110, 112 using the word lines WL1, WL2 and the bit lines BL1, BL2.

Each of the first and second resistive elements 106, 108 (third and fourth MTJ stacks) may be switched between a parallel (P) configuration and an anti-parallel (AP) configuration when a sufficiently large current (larger than a critical current/switching current of the resistive element 106, 108) is applied through it. In the parallel configuration, the magnetic orientations of the fixed layer 106a/108a and the free layer 106c/108c of the resistive element 106/108 may be aligned with each other; whereas, in the anti-parallel configuration, the magnetic orientations of the fixed layer 106a/108a and the free layer 106c/108c of the resistive element 106/108 may be opposite to each other. The third resistance of the first resistive element 106 may have a lower resistance value in the parallel configuration and a higher resistance value in the anti-parallel configuration. Similarly, the fourth resistance of the second resistive element 108 may have a lower resistance value in the parallel configuration and a higher resistance value in the anti-parallel configuration. The switching direction of each resistive element 106, 108 depends on the direction of the current through it, that may in turn depend on the first voltage (V1) and the second external voltage VSS, or the second voltage (V2) and the first external voltage VDD.

In some non-limiting examples, the first and second voltages (V1, V2) may be set such that currents flow through the first and second resistive elements 106, 108 in a same direction and thus, the first and second resistive elements 106, 108 may be programmed to be in a same (parallel or anti-parallel) configuration. Accordingly, the third and fourth resistances of the first and second resistive elements 106, 108 may have approximately a same value.

For instance, in a first non-limiting example, the first voltage (V1) may be set higher than the second external voltage (VSS), and the second voltage (V2) may be set lower than the first external voltage (VDD), so that a first current may flow through the first resistive element 106 (third MTJ stack), and a second current may flow through the second resistive element 108 (fourth MTJ stack) in a same direction. In particular, the first and second currents may each flow through the respective resistive element 106, 108 from the free layer 106c, 108c to the fixed layer 106a, 108a. Such current flows may cause both the first and second resistive elements 106, 108 to be in a parallel configuration. For example, as shown in FIG. 1, the magnetic orientations of the free layers 106c, 108c of both the first and second resistive elements 106, 108 may point towards the positive y direction similar to the magnetic orientations of their fixed layers 106a, 108a. Accordingly, the third and fourth resistances of the first and second resistive elements 106, 108 may both have the lower resistance value.

In alternative non-limiting examples, the first and second voltages (V1, V2) may be set such that currents flow through the first and second resistive elements 106, 108 in different directions, and thus, the first and second resistive elements 106, 108 may be in different (parallel or anti-parallel) configurations. Accordingly, the third and fourth resistances of the first and second resistive elements 106, 108 may have different values.

For instance, in a second non-limiting example, the first voltage (V1) may be set higher than the second external voltage (VS S) so that a first current may flow through the first resistive element 106 (third MTJ stack) from the free layer 106c to the fixed layer 106a. Such a current flow may cause the first resistive element 106 (third MTJ stack) to be in a parallel configuration and in turn, the third resistance of the first resistive element 106 to have the lower resistance value. On the other hand, the second voltage (V2) may be set higher than the first external voltage (VDD) so that a second current may flow through the second resistive element 108 (fourth MTJ stack) from the fixed layer 108a to the free layer 108c. Such a current flow may cause the second resistive element 108 (fourth MTJ stack) to be in an anti-parallel configuration and in turn, the fourth resistance of the second resistive element 108 to have the higher resistance value. In other words, the fourth resistance of the second resistive element 108 (fourth MTJ stack) may be higher than the third resistance of the first resistive element 106 (third MTJ stack). For example, if the tunnel magnetoresistance (TMR) of the first and second resistive elements 106, 108 is 200 and the lower resistance value of the first and second resistive elements 106, 108 is 1 kΩ, then the third resistance of the first resistive element 106 (third MTJ stack) may be programmed to have the lower resistance value of 1 kΩ. Whereas, the fourth resistance of the second resistive element 108 (fourth MTJ stack) may be programmed to have the higher resistance value of 3 kΩ (three times of the value of the third resistance). As compared to the first non-limiting example described above where the third and fourth resistances are programmed to be approximately equal, the sensitivity of the device 100 may be greater in this second non-limiting example due to the greater difference between the third and fourth resistances of the first and second resistive elements 106, 108.

When an external magnetic field is applied to the device 100 after programming the device 100, the first and second resistances of the first and second MTJ stacks 102, 104 may change according to the magnitude (H) of the external magnetic field. On the other hand, the third and fourth resistances of the first and second resistive elements 106, 108 (third and fourth MTJ stacks) may remain constant, or in other words, may be independent of the magnitude (H) of the external magnetic field. The first and second external voltages VDD, VSS may be configured such that the potential difference (VDD−VSS) between them may not cause a current flow through the resistive elements 106, 108 that is larger than the critical current (or switching current) required to switch the resistive elements 106, 108 between the parallel and anti-parallel configurations.

Figure 2:
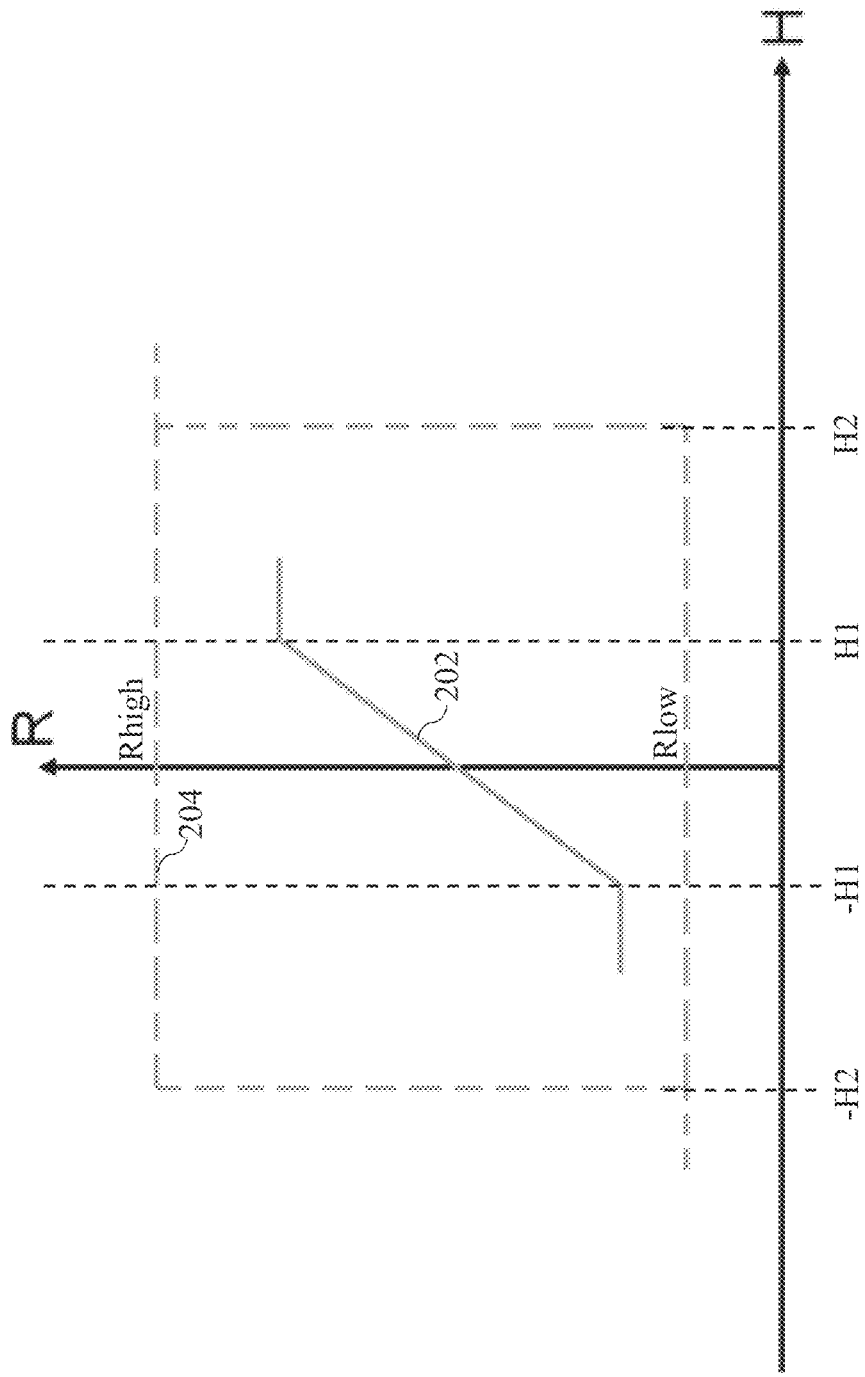
FIG. 2 shows how resistances of MTJ stacks in the semiconductor device of FIG. 1 may change when a magnitude of an external magnetic field changes according to various non-limiting embodiments.

FIG. 2 shows how the first, second, third and fourth resistances of the first and second MTJ stacks 102, 104 and the first and second resistive elements 106, 108 may change when the magnitude (H) of an external magnetic field changes according to various non-limiting embodiments. In particular, plot 202 shows how the first and second resistances of the first and second MTJ stacks 102, 104 may vary with the magnitude (H) of the external magnetic field. As shown by the plot 202, there may be a linear change in the first and second resistances as the magnitude (H) of the external magnetic field changes between –H1 to H1. (In FIG. 2, a positive magnitude indicates that the external magnetic field may be applied in a first direction and a negative magnitude indicates that the external magnetic field may be applied in a second direction opposite the first direction). Further, the working range of the first and second MTJ stacks 102, 104 may be limited to between –H1 to H1, and the first and second resistances may remain constant when the magnitude (H) of the external magnetic field changes beyond this working range. Plot 204 shows how the third and fourth resistances of the first and second resistive elements 106, 108 may switch from the lower resistance value (Rlow) to the higher resistance value (Rhigh) when the magnitude (H) of the external magnetic field is –H2, and from the higher resistance value (Rhigh) to the lower resistance value (Rlow) when the magnitude (H) of the external magnetic field is H2. However, the third and fourth resistances of the first and second resistive elements 106, 108 may remain constant within the working range of the first and second MTJ stacks 102, 104.

The first and second voltages (V1, V2) may be dependent on the first, second third and fourth resistances of the first and second MTJ stacks 102, 104, and the first and second resistive elements 106, 108 according to the following Equations (1) and (2).

$$V1 = \text{Third resistance}/(\text{Third resistance} + \text{First resistance}) \quad (1)$$

$$V2 = \text{Second resistance}/(\text{Second resistance} + \text{Fourth resistance}) \quad (2)$$

As described above, when the magnitude (H) of the external magnetic field changes within the working range of the first and second MTJ stacks 102, 104, the first and second resistances may change and accordingly, the first and second voltages (V1, V2) may change based on the above Equations (1) and (2). Therefore, the magnitude (H) of the external magnetic field may be determined by measuring the first and second voltages (V1, V2). For example, the magnitude of the external magnetic field may be determined by determining the difference (V1–V2) between the first and second voltages (V1, V2).

Figure 3:
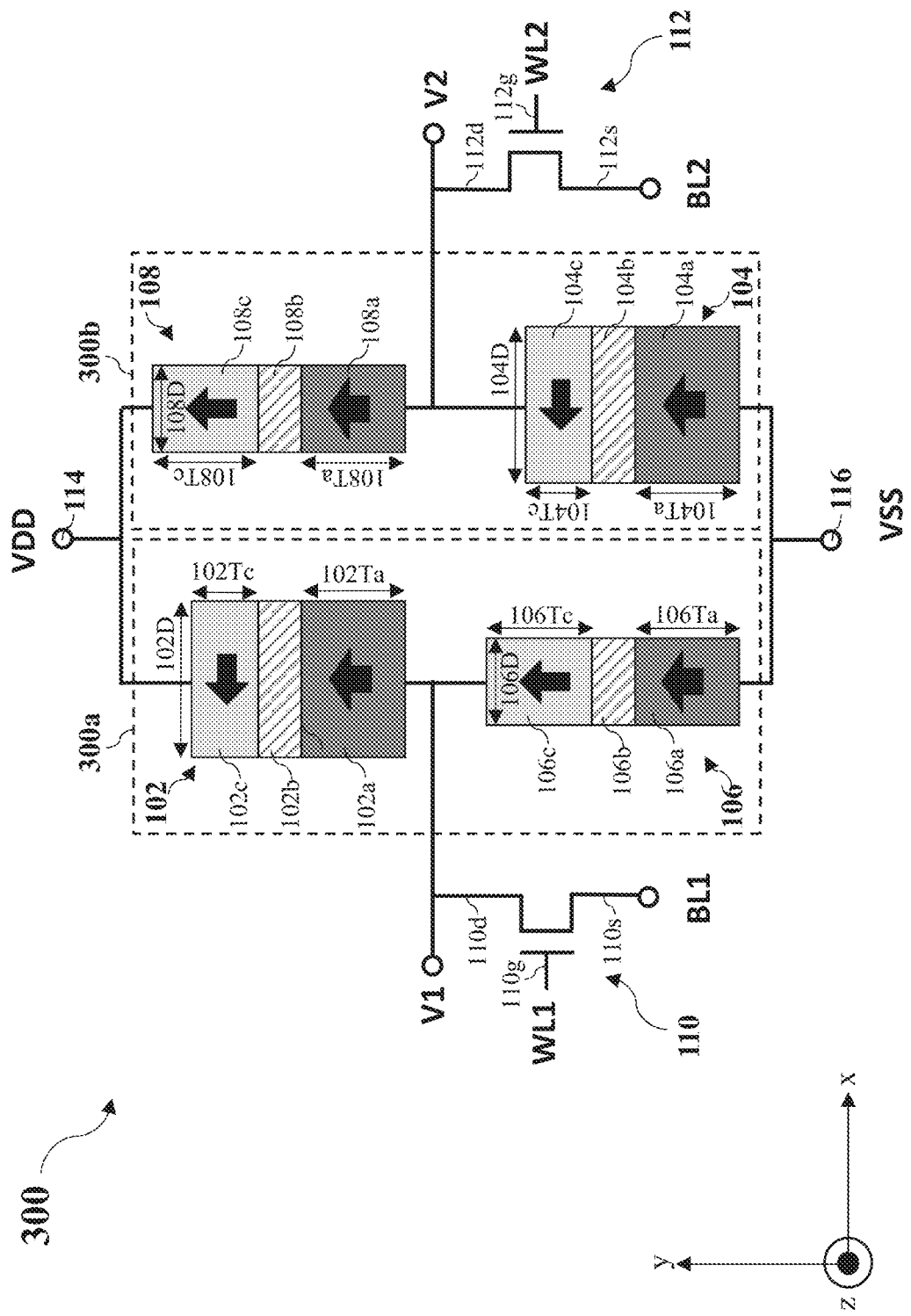
FIG. 3 shows a simplified schematic diagram of a semiconductor device according to alternative non-limiting embodiments.

FIG. 3 shows a simplified schematic diagram of a semiconductor device 300 according to alternative non-limiting embodiments. The semiconductor device 300 is similar to the semiconductor device 100, and thus the common features are labelled with the same reference numerals and need not be discussed.

As shown in FIG. 3, the device 300 may also include a first series portion 300a including a first MTJ stack 102 and a first resistive element 106 (including a third MTJ stack) electrically connected in series, and a second series portion 300b including a second MTJ stack 104 and a second resistive element 108 (including a fourth MTJ stack) electrically connected in series where the first and second series portions 300a, 300b may be electrically connected in parallel. The diameters 102D, 104D, 106D, 108D and the thicknesses 102Ta, 104Ta, 106Ta, 108Ta of the fixed layers 102a, 104a, 106a, 108a of the first and second MTJ stacks 102, 104 and the first and second resistive elements 106, 108 may be similar to those in the device 100. The thicknesses 102Tc, 104Tc of the free layers 102c, 104c of the first and second MTJ stacks 102, 104 may also be similar to that in the device 100.

However, in the device 300, the thickness 106Tc of the free layer 106c of the first resistive element 106 (third MTJ stack) may be greater than the third diameter 106D of the first resistive element 106, and the thickness 108Tc of the free layer 108c of the second resistive element 108 (fourth MTJ stack) may be greater than the fourth diameter 108D of the second resistive element 108. Further, the thicknesses 106Tc, 108Tc of the free layers 106c, 108c of the first and second resistive elements 106, 108 (third and fourth MTJ stacks) may be approximately equal and may both be greater than the thickness 102Tc of the free layer 102c of the first MTJ stack 102 and the thickness 104Tc of the free layer 104c of the second MTJ stack 104. For example, the thicknesses 106Tc, 108Tc of the free layers 106c, 108c of the first and second resistive elements 106, 108 in the device 300 may range from about 20 nm to about 60 nm. A ratio of the thickness 106Tc of the free layer 106c of the first resistive element 106 (or thickness 108Tc of the free layer 108c of the second resistive element 108) to the thickness 102Tc of the free layer 102c of the first MTJ stack 102 (or thickness 104Tc of the free layer 104c of the second MTJ stack 104) may be more than one. A ratio of the thickness 106Tc of the free layer 106c of the first resistive element 106 (or thickness 108Tc of the free layer 108c of the second resistive element 108) to the third diameter 106D of the first resistive element 106 (or fourth diameter 108D of the second resistive element 108) may be more than one.

By configuring the device 300 such that the free layers 106c, 108c of the first and second resistive elements 106, 108 (third and fourth MTJ stacks) have greater thicknesses 106Tc, 108Tc, the above-described magnetic orientations may be more easily achieved as compared to device 100. This may be because the magnetic orientation of a magnetic material usually aligns along an easy axis parallel to a longest dimension of the magnetic material, and therefore, increasing the thicknesses 106Tc, 108Tc can help the magnetic orientations of the free layers 106c, 108c of the first and second resistive elements 106, 108 align along the y axis more easily.

In alternative non-limiting embodiments, there may be provided a device similar to the device 300 as described above where the thickness 106Tc of the free layer 106c of the first resistive element 106 (third MTJ stack) may be greater than the third diameter 106D of the first resistive element 106, and the thickness 108Tc of the free layer 108c of the second resistive element 108 (fourth MTJ stack) may be greater than the fourth diameter 108D of the second resistive element 108. However, the thicknesses 106Tc, 108Tc of the free layers 106c, 108c of the first and second resistive elements 106, 108 (third and fourth MTJ stacks) may be smaller (instead of greater) than the thicknesses 102Tc, 104Tc of the free layers 102c, 104c of the first and second MTJ stacks 102. In these alternative non-limiting embodiments, the first and second MTJ stacks 102, 104 may be configured differently from those in the device 300 to achieve the magnetic orientations as described above. For instance, in a first alternative non-limiting embodiment, the first and second MTJ stacks 102, 104 may be configured to have larger first and second diameters 102D, 104D (as compared to that in the device 300) so that these diameters 102D, 104D may remain greater than the thicknesses 102Tc, 104Tc of their free layers 102c, 104c. In a second alternative non-limiting embodiment, the first and second MTJ stacks 102, 104 may be ellipsoidal (instead of cylindrical) in shape where a length of each of the first and second MTJ stacks 102, 104 along the x direction may be greater than a length of each of the first and second MTJ stacks 102, 104 along the z direction. The length of each of the first and second MTJ stacks 102, 104 along the z direction in this second alternative non-limiting embodiment may be approximately equal to the thicknesses 102Tc, 104Tc of the free layers 102c, 104c.

Figure 4:
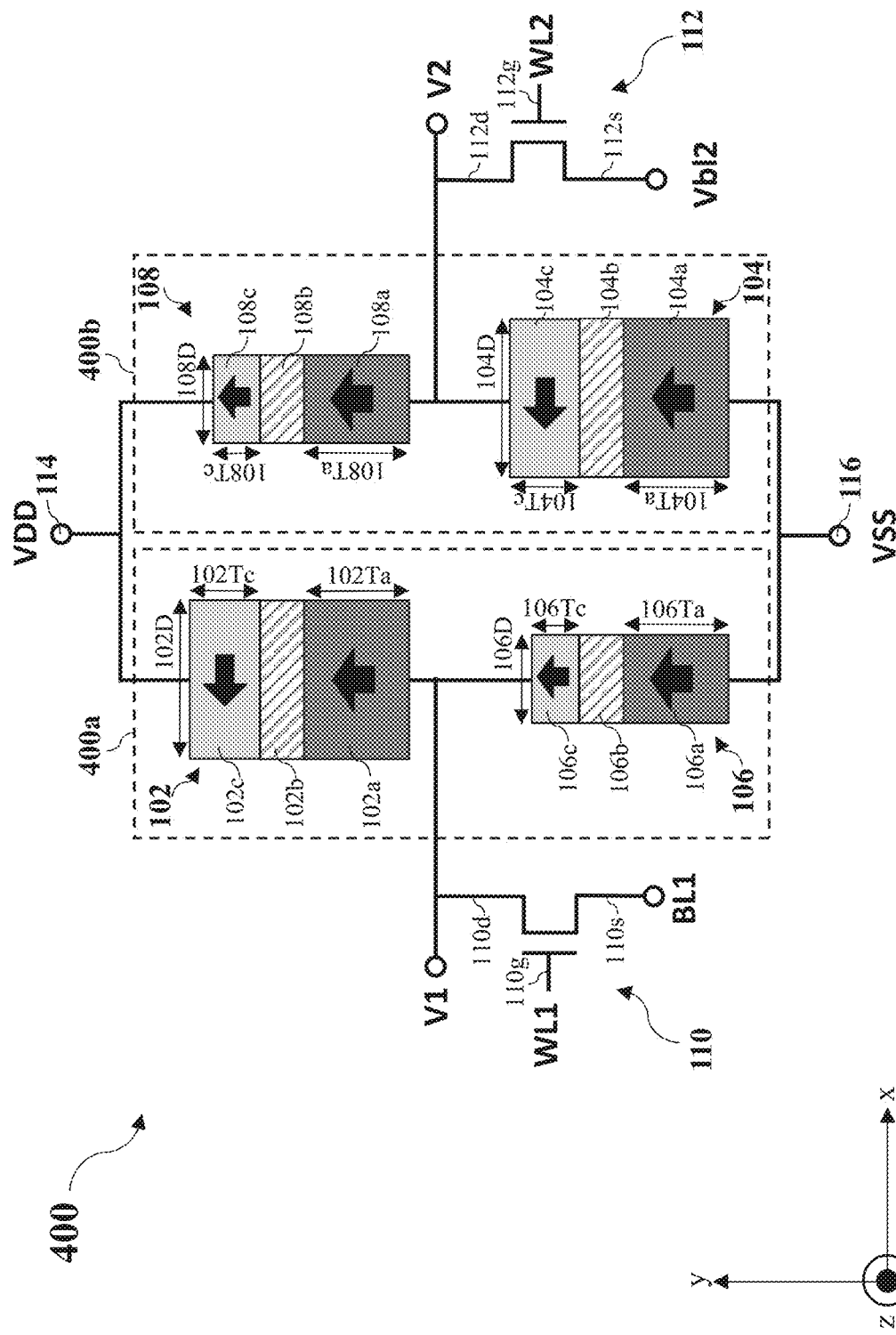
FIG. 4 shows a simplified schematic diagram of a semiconductor device according to alternative non-limiting embodiments.

FIG. 4 shows a simplified schematic diagram of a semiconductor device 400 according to an alternative non-limiting embodiment. The semiconductor device 400 is similar to the semiconductor device 100, and thus the common features are labelled with the same reference numerals and need not be discussed.

As shown in FIG. 4, the device 400 may also include a first series portion 400a including a first MTJ stack 102 and a first resistive element 106 (including a third MTJ stack) electrically connected in series, and a second series portion 400b including a second MTJ stack 104 and a second resistive element 108 (including a fourth MTJ stack) electrically connected in series. The first and second series portions 400a, 400b may be electrically connected in parallel. The diameters 102D, 104D, 106D, 108D and the thicknesses 102Ta, 104Ta, 106Ta, 108Ta of the fixed layers 102a, 104a, 106a, 108a of the first and second MTJ stacks 102, 104 and the first and second resistive elements 106, 108 may be similar to those in the device 100. The thicknesses 102Tc, 104Tc of the free layers 102c, 104c of the first and second MTJ stacks 102, 104 may also be similar to that in the device 100.

However, in the device 400, the thickness 106Tc of the free layer 106c of the first resistive element 106 (third MTJ stack) may be smaller than the third diameter 106D of the first resistive element 106, and the thickness 108Tc of the free layer 108c of the second resistive element 108 (fourth MTJ stack) may be smaller than the fourth diameter 108D of the second resistive element 108. Further, the thicknesses 106Tc, 108Tc of the free layers 106c, 108c of the first and second resistive elements 106, 108 (third and fourth MTJ stacks) may be approximately equal and may both be smaller than the thickness 102Tc of the free layer 102c of the first MTJ stack 102 and the thickness 104Tc of the free layer 104c of the second MTJ stack 104. For example, the thicknesses 106Tc, 108Tc of the free layers 106c, 108c of the first and second resistive elements 106, 108 (third and fourth MTJ stacks) may range from about 1 nm to about 3 nm, and in a non-limiting embodiment, may range from about 1.5 nm to about 2.5 nm. In addition, the free layers 106c, 108c of the first and second resistive elements 106, 108 (third and fourth MTJ stacks) may include a greater amount of iron (Fe) as compared to the free layers 102c, 104c of the first and second MTJ stacks 102, 104. For example, the free layers 106c, 108c of the first and second resistive elements 106, 108 may include iron rich cobalt-iron-boron (CoFeB).

By configuring the device 400 with the free layers 106c, 108c of the first and second resistive elements 106, 108 (third and fourth MTJ stacks) having smaller thicknesses 106Tc, 108Tc and including a greater amount of iron (Fe), the above-mentioned magnetic orientations may be more easily achieved in the device 400 than in the device 100.

Figure 5:
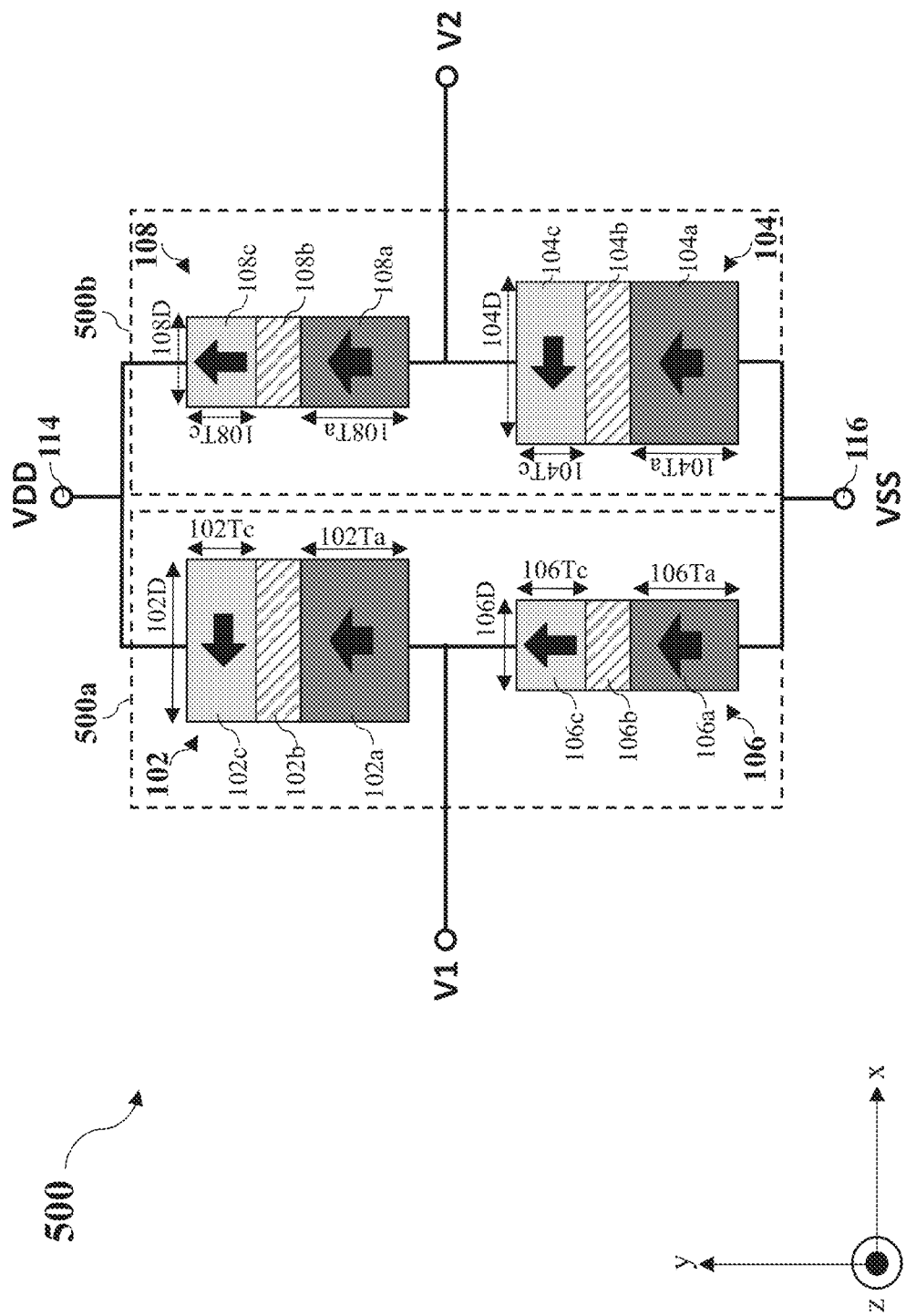
FIG. 5 shows a simplified schematic diagram of a semiconductor device according to alternative non-limiting embodiments.

FIG. 5 shows a simplified schematic diagram of a semiconductor device 500 according to an alternative non-limiting embodiment. The semiconductor device 500 is similar to the semiconductor device 100, and thus the common features are labelled with the same reference numerals and need not be discussed.

As shown in FIG. 5, the device 500 may also include a first series portion 500a and a second series portion 500b similar to the first and second series portions 100a, 100b of the device 100. However, the first and second voltage adjusting elements 110, 112 may be absent in the device 500. Accordingly, the first and second voltages (V1, V2) may be directly adjusted to adjust the third and fourth resistances of the first and second resistive elements 106, 108. The fabrication process of the device 500 may thus be simpler than that of the devices 100, 300, 400.

In some alternative non-limiting embodiments, the structures of the first and second MTJ stacks 102, 104 and the first and second resistive elements 106, 108 may differ from those described above.

For instance, the MTJ stacks 102, 104 and the resistive elements 106, 108 need not be cylindrical. In a non-limiting example, the MTJ stacks 102-108 may have a generally cuboid shape. The relation between the lengths of these cuboidal MTJ stacks 102-108 along the x and z directions may be similar to any one of the above-described relations between the diameters 102D-108D of the cylindrical MTJ stacks 102-108. Further, the relation of the lengths of these cuboidal MTJ stacks 102-108 along the x and z directions relative to the thicknesses 102Tc-108Tc of their free layers 102c-108c may also be similar to any one of the above-described relations of the diameters of the MTJ stacks 102-108 relative to the thicknesses 102Tc-108Tc of their free layers 102c-108c.

Further, the MTJ stacks 102-108 may have a same number of layers but need not have a similar structure. For example, in some alternative non-limiting embodiments, one of the MTJ stacks 102-108 may have a cylindrical structure; whereas, another one of the MTJ stacks 102-108 may have an ellipsoidal structure.

Also, the thicknesses 106Tc, 108Tc of the free layers 106c, 108c of the first and second resistive elements 106, 108 may be different in some alternative non-limiting embodiments. For example, the thickness 106Tc of the free layer 106c of the first resistive element 106 may be greater than its diameter 106D (similar to that in the device 300); whereas, the thickness 108Tc of the free layer 108c of the second resistive element 108 may be smaller than its diameter 108D (similar to that in the device 400), provided that the magnetic orientations in the devices 300, 400 may still be achieved. The thicknesses 102Tc, 104Tc of the free layers 102c, 104c of the first and second MTJ stacks 102, 104 may also differ from each other. In addition, the first and second diameters 102D, 104D may differ from each other and/or the third and fourth diameters 106D, 108D may also differ from each other.

In some alternative non-limiting embodiments, the first and second resistive elements 106, 108 may not include MTJ stacks and may include other types of components.

Figure 6:
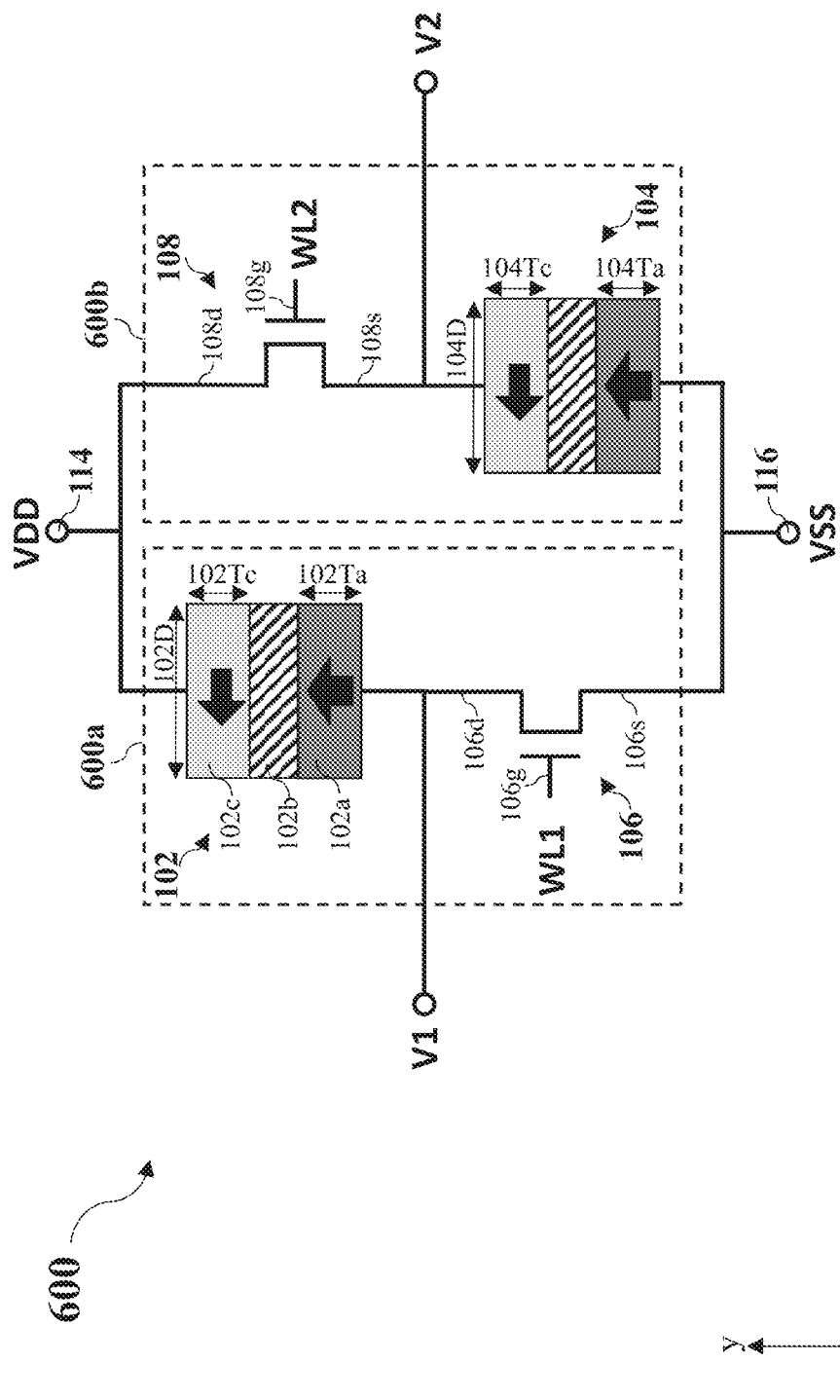
FIG. 6 shows a simplified schematic diagram of a semiconductor device according to alternative non-limiting embodiments.

FIG. 6 shows a simplified schematic diagram of a semiconductor device 600 according to an alternative non-limiting embodiment. The semiconductor device 600 is similar to the semiconductor device 100, and thus the common features are labelled with the same reference numerals and need not be discussed.

The device 600 may also include a first series portion 600a including a first MTJ stack 102 and a first resistive element 106 electrically connected in series, and a second series portion 600b including a second MTJ stack 104 and a second resistive element 108 electrically connected in series where the first series portion 600a may be electrically connected in parallel to the second series portion 600b. However, instead of the third and fourth MTJ stacks, in the device 600, the first resistive element 106 may include a first transistor and the second resistive element 108 may include a second transistor. Each of the first and second resistive elements 106, 108 may include a source 106s, 108s, a drain 106d, 108d and a gate 106g, 108g. The gates 106g, 108g of the resistive elements 106, 108 may be connected to respective word lines WL1, WL2. The third and fourth resistances may be programmed by adjusting the gate voltages at the gates 106g, 108g of the first and second resistive elements 106, 108 using the word lines WL1, WL2. By changing the gate voltages, the channel widths of the first and second resistive elements 106, 108 may change, and thus, the third and fourth resistances may change accordingly. In the non-limiting embodiment of FIG. 6, the device 600 may be similar to device 500 in that the voltage adjusting elements 110, 112 may be absent. However, in alternative non-limiting embodiments, voltage adjusting elements (e.g. voltage adjusting elements 110, 112 of the device 100) may be included in the device 600 to adjust the first and second voltages (V1, V2).

Figure 7:
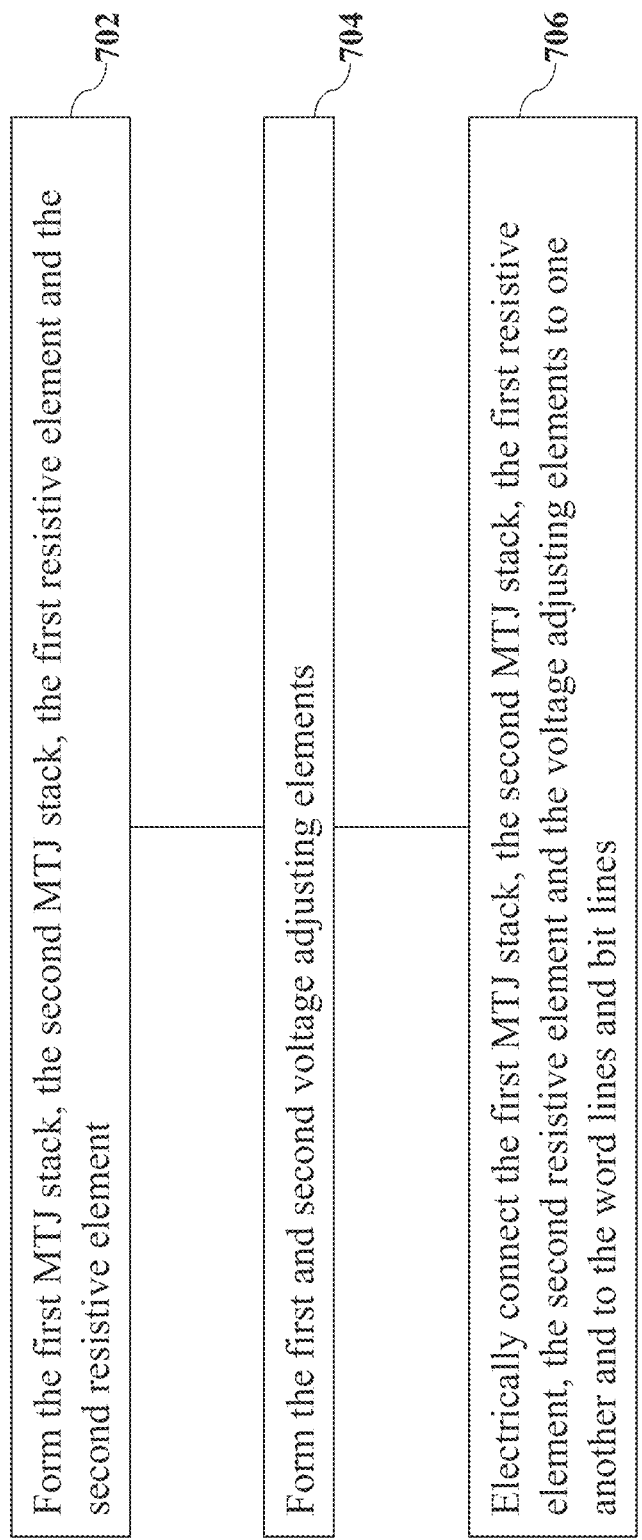
FIG. 7 shows a flow chart illustrating a method for fabricating the semiconductor device of FIG. 1 according to various non-limiting embodiments.

FIG. 7 shows a flowchart illustrating a method for fabricating the device 100 according to various non-limiting embodiments.

As shown in FIG. 7, at 702, the method may include forming the first MTJ stack 102, the second MTJ stack 104, the first resistive element 106 and the second resistive element 108. The method may further include (at 704) forming the first and second voltage adjusting elements 110, 112. The method may then include (at 706) electrically connecting the first MTJ stack 102, the second MTJ stack 104, the first resistive element 106, the second resistive element 108 and the voltage adjusting elements 110, 112 to one another and to the word lines WL1, WL2 and bit lines Bl1, Bl2 to achieve the electrical connections as described above. For example, the first MTJ stack 102 and the first resistive element 104 may be electrically connected in series to form the first series portion 100a. The second MTJ stack 104 and the second resistive element 108 may be electrically connected in series to form the second series portion 100b, and the second series portion 100b may be electrically connected in parallel with the first series portion 100a.

In some non-limiting embodiments, the first and second MTJ stacks 102, 104 and the first and second resistive elements 106, 108 (third and fourth MTJ stacks) may be formed simultaneously. FIGS. 8A to 8B show simplified cross-sectional views illustrating the fabrication of the first and second MTJ stacks 102, 104 and the first and second resistive elements 106, 108 simultaneously. Referring to FIG. 8A, forming the first and second MTJ stacks 102, 104 and the first and second resistive elements 106, 108 may include depositing first magnetic material 802 over a base element (not shown in FIGS. 8A to 8B) on which the device 100 is to be formed. Insulating material 804 may be deposited over the first magnetic material 802 and second magnetic material 806 may be deposited over the insulating material 804. Referring to FIG. 8B, the method may further include etching the first magnetic material 802, the insulating material 804 and the second magnetic material 806 to form the first MTJ stack 102, the second MTJ stack 104, the first resistive element 106 and the second resistive element 108. Accordingly, the fixed layers 102a, 104a, 106a, 108a of the first MTJ stack 102, the second MTJ stack 104, the first resistive element 106 and the second resistive element 108 may include the first magnetic material; the tunnelling barrier layers 102b, 104b, 106b, 108b of the first MTJ stack 102, the second MTJ stack 104, the first resistive element 106, and the second resistive element 108 may include the insulating material; and the free layers 102c, 104c, 106c, 108c of the first MTJ stack 102, the second MTJ stack 104, the first resistive element 106 and the second resistive element 108 may include the second magnetic material. Note that due to the arrangement of the first and second MTJ stacks 102, 104 and the first and second resistive elements 106, 108, only the first MTJ stack 102 and the first resistive element 106 are visible in FIG. 8B.

The above described order for the method is only intended to be illustrative, and the method is not limited to the above specifically described order unless otherwise specifically stated. The devices 300, 400 may be fabricated in a similar manner, except that the dimensions (e.g. thicknesses 106Tc, 108Tc) of the first and second resistive elements 106, 108 may be modified accordingly. The device 500 may also be fabricated in a similar manner but with the fabrication of the voltage adjusting elements 110, 112 omitted. The device 600 may also be fabricated in a similar manner, except that the fabrication of the third and fourth MTJ stacks may be omitted, and the first and second resistive elements 106, 108 may be fabricated (using any transistor fabrication process as known in the art) after forming the first and second MTJ stacks 102, 104.

As described above, the MTJ stacks 102, 104, 106, 108 of the devices 100, 300, 400, 500 may include a same number of layers and may thus be fabricated simultaneously. Similarly, the first and second MTJ stacks 102, 104 of the device 600 may also include a same number of layers and may also be fabricated simultaneously. This can help reduce the number of process steps and the complexity in fabricating the devices 100, 300, 400, 500, 600. Further, as mentioned above, each of the first and second MTJ stacks 102, 104 may have an in-plane free layer 102c, 104c and a perpendicular-plane fixed layer 102a, 104a. Such MTJ stacks 102, 104 may have improved sensitivity and tunnel-magnetoresistance. Thus, the sensitivity of the devices 100, 300, 400, 500, 600 may be improved.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:
1. A tunnel magnetoresistance sensor device comprising:
a first series portion comprising a first magnetic tunnel junction (MTJ) stack and a first resistive element electrically connected in series; and
a second series portion comprising a second MTJ stack and a second resistive element electrically connected in series, the second series portion being electrically connected in parallel with the first series portion,
wherein the first resistive element comprises a third MTJ stack and the second resistive element comprises a fourth MTJ stack; wherein the first MTJ stack, the second MTJ stack, the third MTJ stack, and the fourth MTJ stack comprise a same number of layers; wherein the same number of layers comprises a fixed layer, a free layer, and a tunnelling barrier layer between the fixed layer and the free layer, wherein the magnetization orientations of the fixed layers of the first MTJ stack, the second MTJ stack, the third MTJ stack, and the fourth MTJ stack are substantially parallel; and wherein the magnetic orientations of the free layers of the third MTJ stack and the fourth MTJ stack are substantially perpendicular to the magnetic orientations of the free layers of the first MTJ stack and the second MTJ stack.

2. The tunnel magnetoresistance sensor device of claim 1, further comprising a first voltage terminal and a second voltage terminal; wherein the first MTJ stack and the second resistive element are connected to the first voltage terminal; and wherein the second MTJ stack and the first resistive element are connected to the second voltage terminal.

3. The tunnel magnetoresistance sensor device of claim 1, wherein a resistance of the first resistive element is adjustable by adjusting a first voltage between the first MTJ stack and the first resistive element; and wherein a resistance of the second resistive element is adjustable by adjusting a second voltage between the second MTJ stack and the second resistive element.

4. The tunnel magnetoresistance sensor device of claim 3, further comprising a first voltage adjusting element electrically connected between the first MTJ stack and the first resistive element to adjust the first voltage; and further comprising a second voltage adjusting element electrically connected between the second MTJ stack and the second resistive element to adjust the second voltage.

5. The tunnel magnetoresistance sensor device of claim 4, wherein the first voltage adjusting element comprises a first voltage adjusting transistor and the second voltage adjusting element comprises a second voltage adjusting transistor.

6. The tunnel magnetoresistance sensor device of claim 1, wherein a third diameter of the third MTJ stack is smaller than a first diameter of the first MTJ stack and a second diameter of the second MTJ stack.

7. The tunnel magnetoresistance sensor device of claim 1, wherein a fourth diameter of the fourth MTJ stack is smaller than a first diameter of the first MTJ stack and a second diameter of the second MTJ stack.

8. The tunnel magnetoresistance sensor device of claim 1, wherein a thickness of the free layer of the third MTJ stack is greater than a third diameter of the third MTJ stack.

9. The tunnel magnetoresistance sensor device of claim 1, wherein a thickness of the free layer of the fourth MTJ stack is greater than a fourth diameter of the fourth MTJ stack.

10. The tunnel magnetoresistance sensor device of claim 1, wherein a thickness of the free layer of the third MTJ stack is greater than a thickness of the free layer of the first MTJ stack and a thickness of the free layer of the second MTJ stack.

11. The tunnel magnetoresistance sensor device of claim 1, wherein a thickness of the free layer of the fourth MTJ stack is greater than a thickness of the free layer of the first MTJ stack and a thickness of the free layer of the second MTJ stack.

12. The tunnel magnetoresistance sensor device of claim 1, wherein a thickness of the free layer of the third MTJ stack is smaller than a third diameter of the third MTJ stack.

13. The tunnel magnetoresistance sensor device of claim 1, wherein a thickness of the free layer of the fourth MTJ stack is smaller than a fourth diameter of the fourth MTJ stack.

14. The tunnel magnetoresistance sensor device of claim 1, wherein a thickness of the free layer of the third MTJ stack is smaller than a thickness of the free layer of the first MTJ stack and a thickness of the free layer of the second MTJ stack.

15. The tunnel magnetoresistance sensor device of claim 1, wherein a thickness of the free layer of the fourth MTJ stack is smaller than a thickness of the free layer of the first MTJ stack and a thickness of the free layer of the second MTJ stack.

16. The tunnel magnetoresistance sensor device of claim 1, wherein the semiconductor device comprises a sensor device.

17. A method for fabricating a tunnel magnetoresistance sensor device, the method comprising:
  forming a first MTJ stack, a second MTJ stack, a first resistive element, and a second resistive element;
  electrically connecting the first MTJ stack, the second MTJ stack, the first resistive element, and the second resistive element such that the first MTJ stack and the first resistive element are electrically connected in series to form a first series portion, the second MTJ stack and the second resistive element are electrically connected in series to form a second series portion and the second series portion is electrically connected in parallel with the first series portion,
  wherein the first resistive element comprises a third MTJ stack and the second resistive element comprises a fourth MTJ stack; wherein the first MTJ stack, the second MTJ stack, the third MTJ stack, and the fourth MTJ stack comprise a same number of layers; wherein the same number of layers comprises a fixed layer, a free layer, and a tunnelling barrier layer between the fixed layer and the free layer,
  wherein the magnetization orientations of the fixed layers of the first MTJ stack, the second MTJ stack, the third MTJ stack, and the fourth MTJ stack are substantially parallel; and wherein the magnetic orientations of the free layers of the third MTJ stack and the fourth MTJ stack are substantially perpendicular to the magnetic orientations of the free layers of the first MTJ stack and the second MTJ stack.

18. The method of claim 17, wherein forming the first MTJ stack, the second MTJ stack, the first resistive element and the second resistive element comprises:
  depositing first magnetic material over a base element;
  depositing insulating material over the first magnetic material;
  depositing second magnetic material over the insulating material; and
  etching the first magnetic material, the insulating material, and the second magnetic material to form the first MTJ stack, the second MTJ stack, the first resistive element, and the second resistive element; wherein the fixed layers of the first MTJ stack, the second MTJ stack, the first resistive element, and the second resistive element comprise the first magnetic material; wherein the tunnelling barrier layers of the first MTJ stack, the second MTJ stack, the first resistive element, and the second resistive element comprise the insulating material; and wherein the free layers of the first MTJ stack, the second MTJ stack, the first resistive element and the second resistive element comprise the second magnetic material.

19. The tunnel magnetoresistance sensor device of claim 1, wherein the fixed layers of the first, second, third, fourth MTJ stacks comprise a first magnetic material, wherein the free layers of the first, second, third, fourth MTJ stacks comprise a second magnetic material.

\* \* \* \* \*